(12) United States Patent
Xie et al.

(10) Patent No.: US 11,455,194 B2
(45) Date of Patent: Sep. 27, 2022

(54) MANAGEMENT OF UNMAPPED ALLOCATION UNITS OF A MEMORY SUB-SYSTEM

(71) Applicant: MICRON TECHNOLOGY, INC., Boise, ID (US)

(72) Inventors: Tingjun Xie, Milpitas, CA (US); Zhengang Chen, San Jose, CA (US); Zhenlei Shen, Milpitas, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 509 days.

(21) Appl. No.: 16/510,426

(22) Filed: Jul. 12, 2019

(65) Prior Publication Data

US 2021/0011769 A1    Jan. 14, 2021

(51) Int. Cl.
*G06F 9/46* (2006.01)
*G06F 9/50* (2006.01)
*G11C 11/4074* (2006.01)
*G06F 12/06* (2006.01)

(52) U.S. Cl.
CPC .......... *G06F 9/5022* (2013.01); *G06F 9/5016* (2013.01); *G06F 12/0646* (2013.01); *G11C 11/4074* (2013.01)

(58) Field of Classification Search
CPC .. G06F 9/5022; G06F 9/5016; G06F 12/0646; G11C 11/4074
See application file for complete search history.

(56) References Cited

U.S. PATENT DOCUMENTS

| | | |
|---|---|---|
| 9,032,134 B2 | 5/2015 | Gorobets |
| 10,199,106 B2 | 2/2019 | Kim et al. |
| 2008/0279020 A1 | 11/2008 | Ogawa et al. |
| 2017/0084330 A1 | 3/2017 | Ichihara |
| 2019/0065391 A1 | 2/2019 | Davis et al. |

OTHER PUBLICATIONS

PCT International Search Report and Written Opinion for International Application No. PCT/US2020/041219, dated Oct. 13, 2020, 12 pages.

*Primary Examiner* — Gregory A Kessler
(74) *Attorney, Agent, or Firm* — Lowenstein Sandler LLP (57) ABSTRACT

An indication that an allocation unit of a memory sub-system has become unmapped can be received. In response to receiving the indication that the allocation unit of the memory sub-system has become unmapped, the allocation unit can be programmed with a data pattern. Data to be written to the unmapped allocation unit can be received. A write operation can be performed to program the received data at the unmapped allocation unit by using a read voltage that is based on the data pattern.

18 Claims, 6 Drawing Sheets

FIG. 6

MANAGEMENT OF UNMAPPED ALLOCATION UNITS OF A MEMORY SUB-SYSTEM

TECHNICAL FIELD

The present disclosure generally relates to a memory sub-system, and more specifically, relates to management of unmapped allocation units of a memory sub-system.

BACKGROUND

A memory sub-system can be a storage system, a memory module, or a hybrid of a storage device and memory module. A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to management of unmapped allocation units of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

A conventional memory sub-system can store data at allocation units. An allocation unit can be an individual segment or portion of the memory sub-system that can be separately accessed by the host system. For example, an allocation unit can be used to store the smallest amount of data that can be separately retrieved from or written to the memory sub-system. In some embodiments, an allocation unit can be one or more memory cells of the memory components included in the memory sub-system. An allocation unit can be mapped or unmapped. A mapped allocation unit can refer to an allocation unit that has been assigned to a logical address space used by the host system. For example, the mapped allocation unit can be currently used to store and retrieve data for the host system. An unmapped allocation unit can refer to an allocation unit that is not currently assigned to the logical address space used by the host system. For example, an unmapped allocation unit can be part of an overprovisioned group of data blocks of the memory sub-system that are not currently accessible by host system. In some embodiments, an allocation unit can become unmapped when the allocation unit is placed into an erased state.

Allocation units can switch between being mapped and unmapped. For example, an allocation unit can be unmapped at the initial operating life of the memory sub-system and can later be assigned to be accessible to the host system and become mapped. In some embodiments, the allocation unit can be mapped and can become unmapped in response to a host command (e.g., a trim command) or a wear leveling operation that is performed by the memory sub-system. At a later time, the unmapped allocation unit can return to being mapped in response to another host command or wear leveling operation.

The write operation performed by the memory sub-system can utilize a pre-read sub-operation. For example, the memory sub-system can utilize a cross-point array memory where the write operation can be an in-place write operation that can program memory cells of the cross-point array memory without erasing the memory cells. In such an in-place write operation, the pre-read sub-operation can retrieve the current state (e.g., value) of a memory cell and the value of the memory cell can be changed if the value to be written is different than the current value of the memory cell. For example, if a memory cell currently stores a value of '1' and a value of '1' is to be written, then the value of '1' is not programmed again to the memory cell as the stored value matches the requested value.

A memory cell can use a low voltage (LV) state and a high voltage (HV) state to represent different bit values. For example, the LV state can represent a bit value of '0' and a HV state can represent a bit value of '1' (or vice versa). The presence of either the LV state or the HV state (i.e., threshold voltage distribution) can be detected at a memory cell by the application of a voltage (i.e., a read threshold voltage) to the memory cell. However, the threshold voltage distribution of memory cells change or migrate over time due to physical characteristics of the memory cells. As a result, the application of the read threshold voltage to a memory cell as part of a pre-read operation can result in an incorrect value being retrieved. For example, for one type of media component where the threshold voltage distributions migrate towards a higher voltage as a function of time, the memory cell can be incorrectly determined to be at an HV state instead of the original programmed LV state. Thus, since the pre-read operation can return an incorrect value, the memory sub-system can determine to not program the memory cell with the new value if the new value to be programmed matches the value represented by the incorrect HV state. As a result, the number of errors stored at the memory sub-system can increase.

Aspects of the present disclosure address the above and other deficiencies by managing unmapped allocation units of a memory sub-system. For example, the memory sub-system can perform a write operation at an allocation unit when the allocation unit becomes unmapped. The write operation can place memory cells of the allocation unit at a certain state. For example, based on the characteristic (i.e., direction of threshold voltage migration) of the media component, a data pattern (e.g., the high voltage state) can be programmed to each memory cell of the allocation unit. Subsequently, data from a host system can be programmed to the allocation unit when the allocation unit is to become mapped. For example, the data can be written to the allocation unit based on a pre-read voltage that is lower than a voltage of the data pattern or the high voltage state. For example, the read threshold voltage that is used during the pre-read operation can utilize a lowest or a lower read threshold voltage that is available for the memory sub-system.

Advantages of the present disclosure include, but are not limited to, an improvement in the performance of the memory sub-system as retrieved data from the memory sub-system can include fewer errors. For example, for the type of media component where the threshold voltage distributions migrate towards a higher voltage, the data pattern corresponding to the high voltage state can be programmed to memory cells of an allocation unit when the allocation unit is unmapped. Thus, the utilization of a lower read threshold voltage for a pre-read sub-operation can retrieve fewer errors as the lower read threshold voltage can more accurately detect the presence of the high voltage state of the data pattern that is applied to the unmapped allocation unit. Thus, the write operation that uses the results of the pre-read sub-operation can accurately program data as the results of the pre-read sub-operation are used to determine whether to program memory cells of the allocation unit. The performance of the memory sub-system can thus be improved as fewer error correction operations can be performed. For example, fewer read retry operations will be performed to retrieve data from an allocation unit. Thus, more read operations and write operations can be performed by the memory sub-system.

Figure 1:
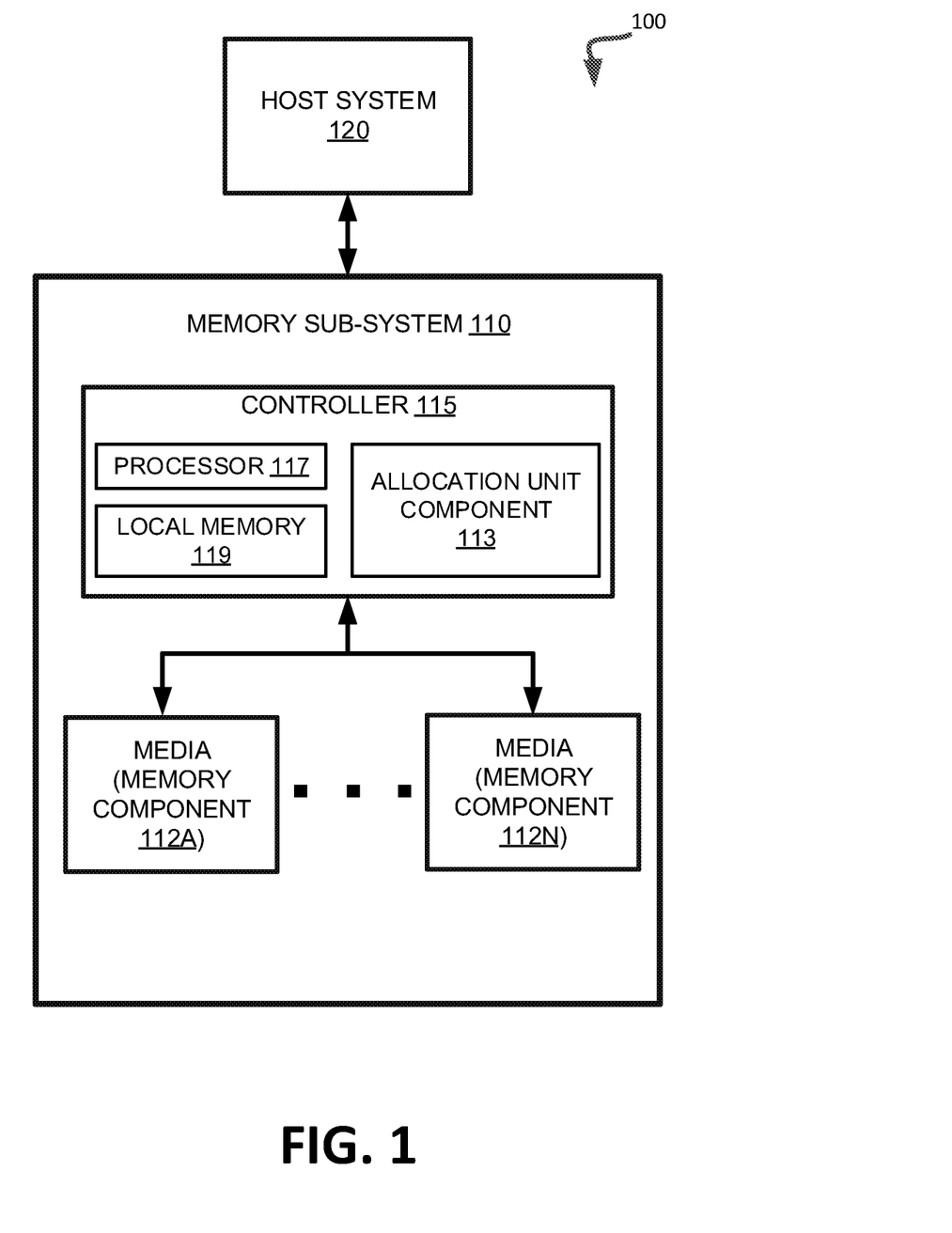
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EE-PROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an allocation unit component 113 that can be used to manage allocation units for the memory sub-system 110. In some embodiments, the controller 115 includes at least a portion of the allocation unit component 113. For example, the controller 115 can include a processor 117 (processing device) configured to execute instructions stored in local memory 119 for performing the operations described herein. In some embodiments, the allocation unit component 113 is part of the host system 120, an application, or an operating system. In the same or alternative embodiments, portions of the allocation unit component 113 are part of the host system 120 while other portions of the allocation unit component 113 are performed at the controller 115.

The allocation unit component 113 can be used to manage allocation units of the memory sub-system. An allocation unit can include one or more memory cells (i.e., a group of memory cells). The allocation unit can become unmapped by an operation from the host system or by an operation (e.g., wear leveling, garbage collection) performed by the memory sub-system. In response to the allocation unit changing from being mapped to becoming unmapped, a write operation can program a data pattern at the allocation unit. For example, each memory cell of the allocation unit can be programmed with a data pattern (e.g., a high voltage state). Subsequently, when host data is to be programmed to the allocation unit, a pre-read sub-operation can be performed at a lower or lowest available read threshold voltage as part of the write operation. Further details with regards to the operations of the allocation unit component 113 are described below.

Figure 2:
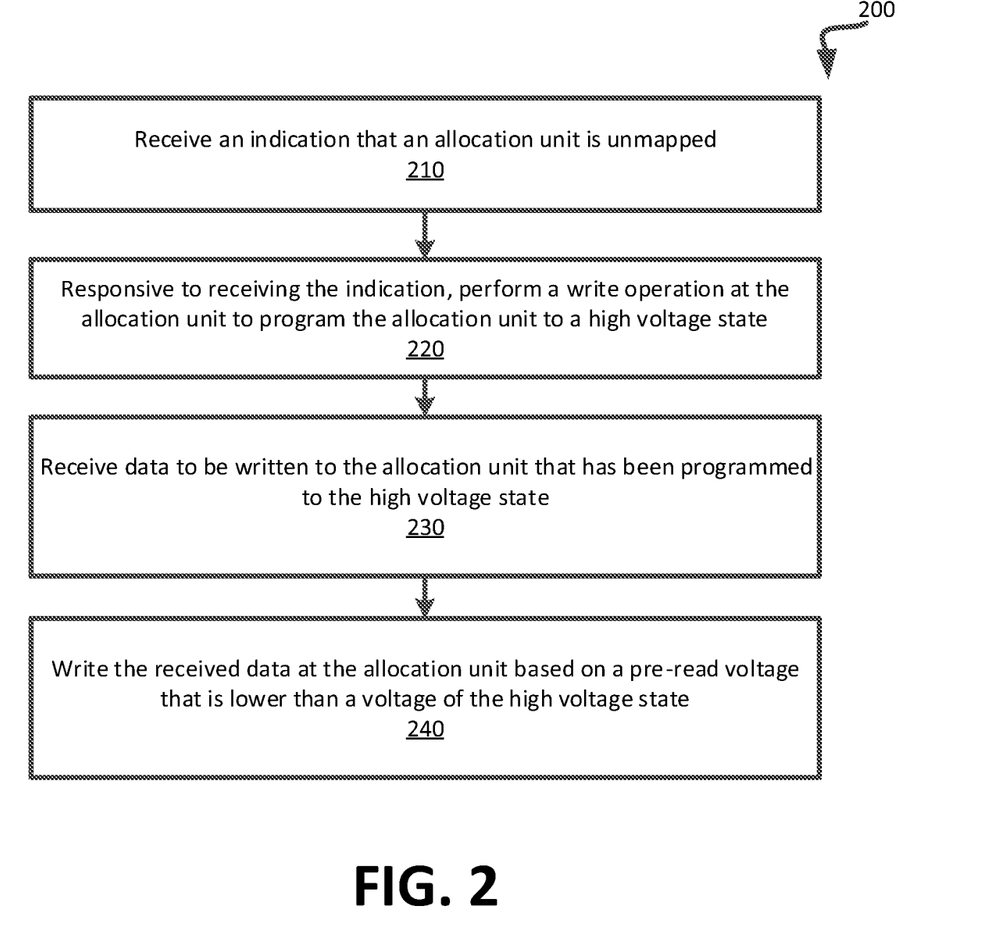
FIG. 2 is a flow diagram of an example method to program a high voltage state at an unmapped allocation unit and to perform a write operation with a lowest pre-read voltage in accordance with some embodiments.

FIG. 2 is a flow diagram of an example method 200 to program a high voltage state at an unmapped allocation unit and to perform a write operation with a lowest pre-read voltage in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the allocation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic receives an indication that an allocation unit is unmapped. For example, the allocation unit can be unmapped at the initial operating life of a memory sub-system that includes the allocation unit. In some embodiments, the allocation unit can transition from being mapped to becoming unmapped. For example, the allocation unit can be assigned a logical address of a logical address space that is used by a host system. A wear leveling operation or a host command (i.e., a trim command) can be used to unmap the allocation unit. The wear leveling operation can remove the allocation unit from the logical address space and assign another currently unmapped allocation unit to the logical address of the removed allocation unit. For example, the allocation unit can be removed from the logical address space when a threshold number of write operations have been performed at the allocation unit. The trim command can be an instruction from the host system to remove an allocation unit from the logical address space. For example, the allocation unit can be removed from being accessed by a logical address that is used by the host system. At operation 220, the processing logic performs a write operation at the allocation unit to program the allocation unit to a high voltage state. For example, a data pattern can be written to one or more memory cells of the allocation unit. The data pattern can be a high voltage state that is stored at each memory cell of the allocation unit. At operation 230, the processing logic receives data to be written to the allocation unit that has been programmed to the high voltage state. For example, the data can be received from a host system. In some embodiments, the allocation unit can become available to the host system when the allocation unit has become mapped to the logical address space of the host system. For example, a wear leveling operation can remove another allocation unit from the logical address space and can add the allocation unit to the logical address space.

Furthermore, at operation 240, the processing logic writes the received data at the allocation unit based on a pre-read voltage that is lower than a voltage of the high voltage state. For example, the write operation to program the received data at the allocation unit can utilize a pre-read sub-operation that reads or retrieves a value of a memory cell of the allocation unit, and compares the retrieved value with a value that is intended to be written to the memory cell. If the values match, then the write operation will not program the memory cell as the intended value is already stored at the memory cell. Thus, no voltage signal is applied to the memory cell to change the stored value. Otherwise, if the values do not match, then the write operation will program the memory cell to update or change the value at the memory cell to match the intended value of the received data. Thus, a voltage signal is applied to the memory cell to change the stored value. As previously discussed, the pre-read voltage can be lower than a voltage of the high voltage state. In some embodiments, the memory sub-system can perform a pre-read sub-operation with multiple different pre-read voltages. The lowest available pre-read voltage can be selected for the pre-read sub-operation. In some embodiments, a lower but not lowest available pre-read voltage can be selected for the pre-read sub-operation. The utilization of a lower pre-read voltage can result in fewer errors when performing the pre-read sub-operation so that the determination of whether to change the value stored at the memory cell can be more accurate.

As described above, the data pattern can be a high voltage state and a lower pre-read voltage is utilized during the pre-read sub-operation. In some embodiments, the data pattern can be a low voltage state and a higher pre-read voltage can be utilized during the pre-read sub-operation. The higher pre-read voltage can be higher than the voltage level of the low voltage state. The data pattern that is used can be based or dependent upon the type of media component. For example, the threshold voltage distributions between different types of media component can change or migrate in different directions with respect to voltage. In some embodiments, the threshold voltage distributions of one type of media component can change or migrate towards a higher voltage as a function of time while the threshold voltage distributions of another type of media component can change or migrate towards a lower voltage as a function of time. The data pattern can be the high voltage state or the low voltage state based on the direction that the threshold voltage distribution changes or migrates for the type of media component. For example, if the threshold voltage distribution (e.g., the LV state and HV state) of a type of media component changes or migrates towards a higher voltage over time, then the data pattern can correspond to the high voltage state. Otherwise, if the threshold voltage distribution (e.g., the LV state and HV state) of a type of media component changes or migrates towards a lower voltage over time, then the data pattern can correspond to the low voltage state. Thus, the data pattern can be based on a characteristic (i.e., direction of threshold voltage migration) of the media component.

Figure 3:
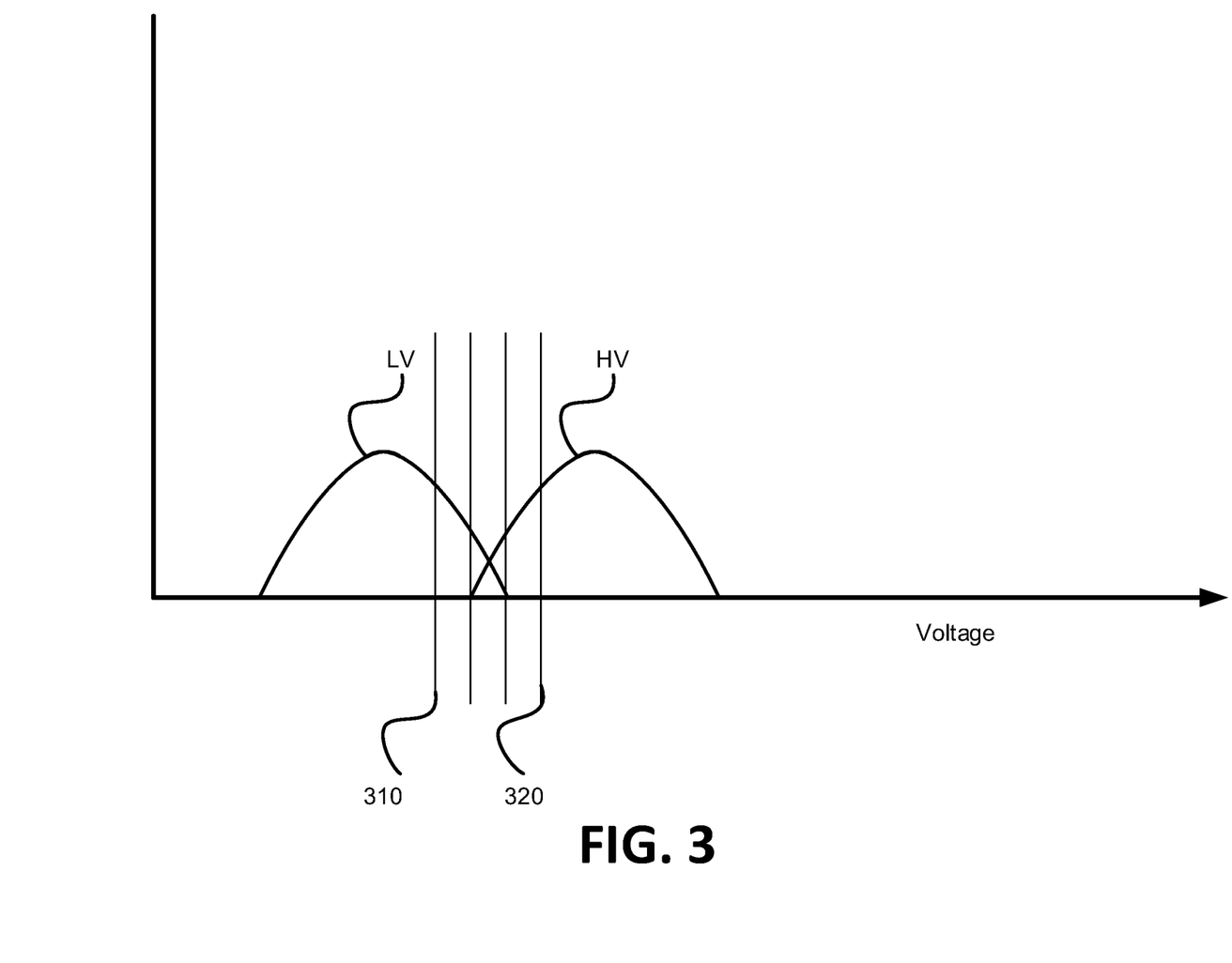
FIG. 3 illustrates voltage states associated with data patterns and pre-read voltages in accordance with some embodiments of the present disclosure.

FIG. 3 illustrates voltage states associated with data patterns and pre-read voltages in accordance with some embodiments of the present disclosure. In some embodiments, a memory cell can be placed at a particular voltage and a particular pre-read voltage can be selected by the allocation component 113 of FIG. 1.

As shown in FIG. 3, a memory cell can be programmed to a low voltage (LV) state or a high voltage (HV) state to represent different bit values (e.g., a '0' or a '1,' or vice versa). Furthermore, a memory sub-system can perform a pre-read sub-operation with multiple pre-read voltages. For example, as shown, the memory sub-system can utilize a lower pre-read voltage 310, two intermediate pre-read voltages, and a higher pre-read voltage 320. If the memory cell was programmed to the high voltage state, then the use of the higher pre-read voltage 320 can result in more errors than the use of the lower pre-read voltage 310. Alternatively, if the memory cell as programmed to the low voltage state, then the use of the lower pre-read voltage 310 can result in more errors than the use of the higher pre-read voltage 320.

Figure 4:
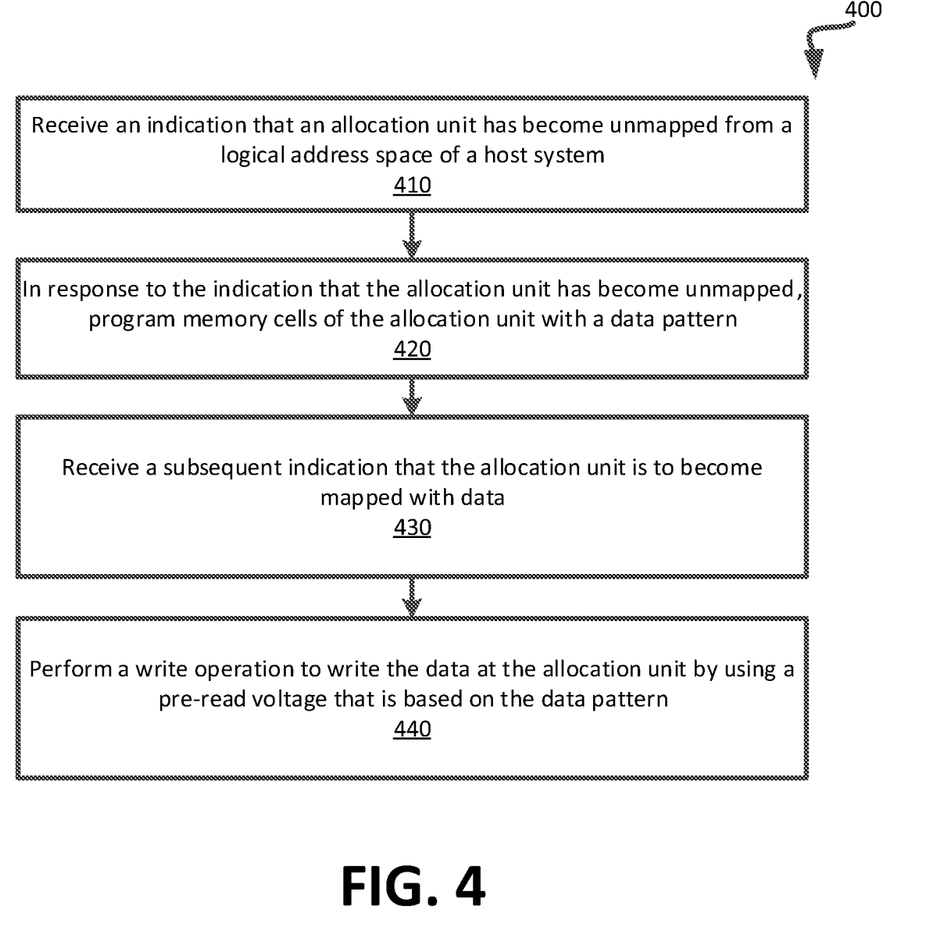
FIG. 4 is a flow diagram of an example method to manage unmapped allocation units based on a data pattern and a pre-read voltage in accordance with some embodiments.

FIG. 4 is a flow diagram of an example method 400 to manage unmapped allocation units based on a data pattern and a pre-read voltage in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the allocation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 4, at operation 410, the processing logic receives an indication that an allocation unit has become unmapped from a logical address space of the host system. In some embodiments, the allocation unit can become unmapped in response to a wear leveling operation or a trim command from a host system. For example, the allocation unit can be removed from the logical address space of a host system and replaced by another allocation unit as part of the wear leveling operation or the allocation unit can be removed from the logical address space in response to the trim command from the host system. At operation 420, the processing logic programs memory cells of the allocation unit with a data pattern in response to receiving the indication that the allocation unit has become unmapped. As previously described, the data pattern can be a high voltage state or a low voltage state based on the type of media component. For example, each memory cell of the allocation unit can be programmed to be at the high voltage state if a threshold voltage distribution of the memory cells migrates or changes towards a higher voltage or each memory cell of the allocation unit can be programmed to be at the low voltage state if the threshold voltage distribution of the memory cells migrates or changes towards a lower voltage. At operation 430, the processing logic receives a subsequent notification that the allocation unit is to become mapped with data. For example, the allocation unit can be added to the logical address space to replace another allocation unit that is to become unmapped and removed from the logical address space. For example, the allocation unit can be added to the logical address space when a wear leveling operation has unmapped another allocation unit and data of the unmapped allocation unit is to be stored at the new allocation unit. In some embodiments, the allocation unit can be added to the logical address space to replace a prior allocation unit that is subjected to a trim command from the host system.

As shown in FIG. 4, at operation 440, the processing logic performs a write operation to write the data at the allocation unit by using a pre-read voltage that is based on the data pattern. For example, the write operation can include a pre-read sub-operation as previously described. The pre-read voltage that is used for the pre-read sub-operation can be based on the voltage state of the data pattern. For example, if the data pattern that is programmed to memory cells of the allocation unit is a low voltage state (e.g., based on the type of media component), then a higher or highest pre-read voltage can be selected for the pre-read sub-operation. Otherwise, if the data pattern that is programmed to the memory cells of the allocation unit is a high voltage state (e.g., based on another type of media component), then a lower or lowest pre-read voltage can be selected for the pre-read sub-operation.

Figure 5A:
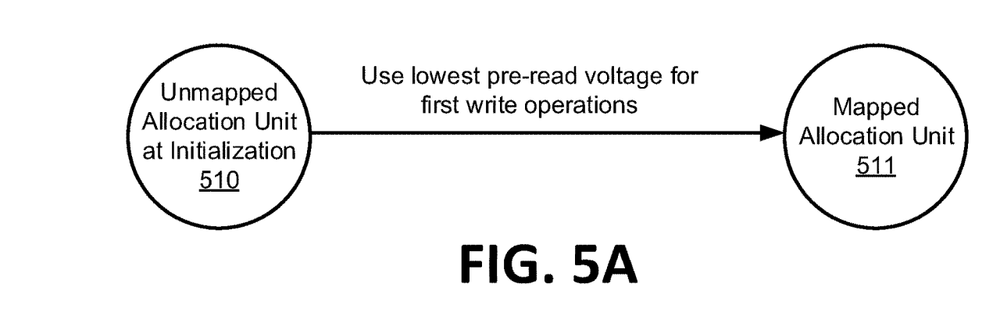
FIG. 5A illustrates the transition between an unmapped allocation unit and a mapped allocation unit in accordance with some embodiments of the present disclosure.

FIG. 5A illustrates the transition between an unmapped allocation unit and a mapped allocation unit in accordance with some embodiments of the present disclosure. In some embodiments, the management of the allocation unit can be performed by the allocation component 113 of FIG. 1.

As shown in FIG. 5A, at initialization of a memory sub-system, an allocation unit can be unmapped. For example, at state 510 at the initial operating life of the memory sub-system, the allocation unit can be unmapped as the memory sub-system has not been used by any host system. In some embodiments, the allocation units of the memory sub-system can be programmed to a high voltage state or a low voltage state at manufacturing with the data pattern based on the type of media component used in the memory sub-system. When the allocation unit transitions to the state 511 to become a mapped allocation unit, a lowest pre-read voltage (or highest pre-read voltage in accordance with the type of media component) can be used. For example, when an allocation unit is added to the logical address space for the first time, the lowest pre-read voltage can be selected for the first write operations that are to write data at the allocation unit.

Figure 5B:
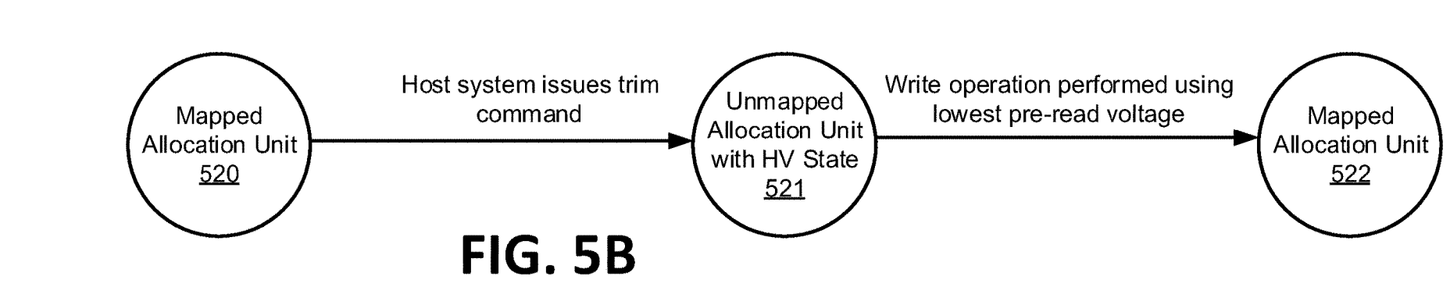
FIG. 5B illustrates the transitions between an unmapped allocation unit and a mapped allocation unit based on host system commands in accordance with some embodiments of the present disclosure.

FIG. 5B illustrates the transitions between an unmapped allocation unit and a mapped allocation unit based on host system commands in accordance with some embodiments of the present disclosure. In some embodiments, the management of the allocation unit can be performed by the allocation component 113 of FIG. 1.

As shown in FIG. 5B, an allocation unit can be mapped at state 520. For example, the allocation unit has been previously added to the logical address space of a host system. Subsequently, the host system can issue a trim command to remove the allocation unit from the logical address space. For example, the trim command indicates to unmap the allocation unit. In response to the removing of the allocation unit from the logical address space, a write operation can be performed on the allocation unit to place the allocation unit at a high voltage state (or a low voltage state in accordance with the type of media component). Thus, at state 521, the allocation unit can be unmapped and at a high voltage state. Subsequently, when the allocation unit is to return to the logical address space, data that is to be stored at the allocation can be written to the allocation unit by using a lowest pre-read voltage (or a highest pre-read voltage in accordance with the type of media component). Thus, the allocation unit can become mapped to the logical address space and can store data from the host system at stage 522.

Figure 5C:
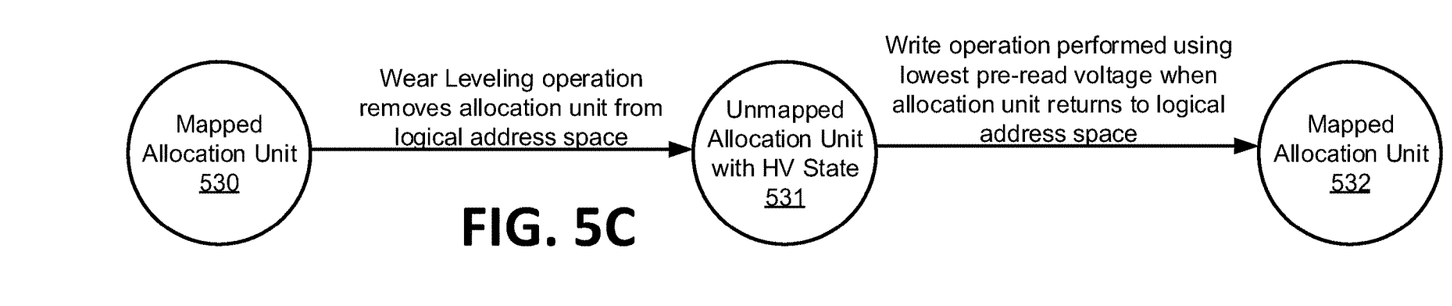
FIG. 5C illustrates the transitions between an unmapped allocation unit and a mapped allocation unit based on wear leveling operations in accordance with some embodiments of the present disclosure.

FIG. 5C illustrates the transitions between an unmapped allocation unit and a mapped allocation unit based on wear leveling operations in accordance with some embodiments of the present disclosure. In some embodiments, the management of the allocation unit can be performed by the allocation component 113 of FIG. 1.

As shown in FIG. 5C, an allocation unit can be mapped at state 530 as a result of the allocation unit being added to a logical address space of a host system. Subsequently, the memory sub-system can perform a wear leveling operation to remove the allocation unit from the logical address space. For example, the wear leveling operation can remove the allocation unit from the logical address space, add a new allocation unit at the logical address space, and can store the data from the removed allocation unit at the new allocation unit. When the allocation unit is unmapped, the allocation unit can be programmed to be at the high voltage state (or a low voltage state in accordance with the type of media component) at state 531. Subsequently, when the allocation unit returns to the logical address space (e.g., as a result of being added in response to a subsequent wear leveling operation), then data can be written to the allocation unit by using a lowest pre-read voltage (or highest pre-read voltage in accordance with the type of media component) when the allocation unit becomes mapped at state 532.

Figure 6:
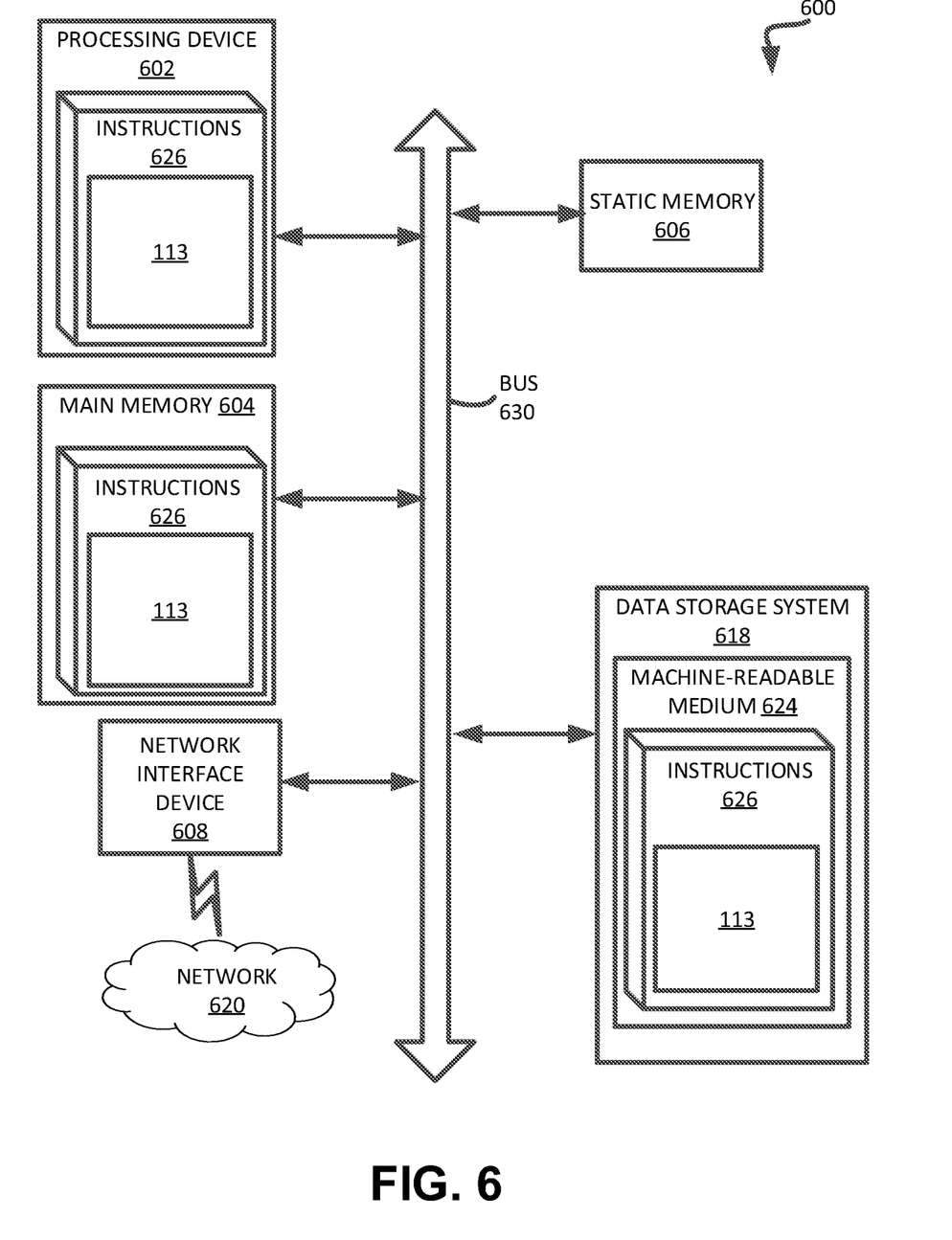
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to an allocation unit component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an allocation unit component (e.g., the allocation unit component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A method comprising:
receiving an indication that an allocation unit of a memory sub-system has become unmapped;
in response to receiving the indication that the allocation unit of the memory sub-system has become unmapped, programming, by a processing device, the allocation unit with a data pattern based on a direction of voltage change of a threshold voltage distribution of the allocation unit;

receiving data to be written to the unmapped allocation unit; and performing a write operation to program the received data at the unmapped allocation unit by using a read voltage that is based on the data pattern.

2. The method of claim 1, wherein the performing of the write operation comprises:

performing a pre-read operation of the unmapped allocation unit by applying the read voltage to the unmapped allocation unit to retrieve a stored value;

comparing the stored value with a value of the received data; and determining whether to write the value of the received data at the allocation unit based on the comparison of the stored value with the value of the received data.

3. The method of claim 1, wherein the allocation unit comprises a plurality of memory cells, and wherein the programming of the allocation unit with the data pattern corresponds to programming the plurality of memory cells to be at a high voltage state, and wherein the read voltage is lower than a voltage level of the high voltage state.

4. The method of claim 1, wherein the allocation unit comprises a plurality of memory cells, and wherein the programming of the allocation unit with the data pattern corresponds to programming the plurality of memory cells to be at a low voltage state, and wherein the read voltage is higher than a voltage level of the low voltage state.

5. The method of claim 1, wherein the allocation unit is unmapped based on the allocation unit being removed from a logical address space of a host system.

6. The method of claim 5, further comprising:

receiving an indication that the allocation unit is to change from being unmapped to being mapped based on the allocation unit being added to the logical address space of the host system, and wherein the data is received to be written to the allocation unit in view of the allocation unit being added to the logical address space.

7. A non-transitory computer-readable medium comprising instructions, which when executed by a processing device, cause the processing device to perform operations comprising:

receiving an indication that an allocation unit of a memory sub-system has become unmapped;

in response to receiving the indication that the allocation unit of the memory sub-system has become unmapped, programming the allocation unit with a data pattern based on a direction of voltage change of a threshold voltage distribution of the allocation unit;

receiving data to be written to the unmapped allocation unit; and performing a write operation to program the received data at the unmapped allocation unit by using a read voltage that is based on the data pattern.

8. The non-transitory computer-readable medium of claim 7, wherein to perform the write operation, the operations further comprise:

performing a pre-read operation of the unmapped allocation unit by applying the read voltage to the unmapped allocation unit to retrieve a stored value;

comparing the stored value with a value of the received data; and determining whether to write the value of the received data at the allocation unit based on the comparison of the stored value with the value of the received data.

9. The non-transitory computer-readable medium of claim 7, wherein the allocation unit comprises a plurality of memory cells, and wherein the programming of the allocation unit with the data pattern corresponds to programming the plurality of memory cells to be at a high voltage state, and wherein the read voltage is lower than a voltage level of the high voltage state.

10. The non-transitory computer-readable medium of claim 7, wherein the allocation unit comprises a plurality of memory cells, and wherein the programming of the allocation unit with the data pattern corresponds to programming the plurality of memory cells to be at a low voltage state, and wherein the read voltage is higher than a voltage level of the low voltage state.

11. The non-transitory computer-readable medium of claim 7, wherein the allocation unit is unmapped based on the allocation unit being removed from a logical address space of a host system.

12. The non-transitory computer-readable medium of claim 11, wherein the operations further comprise:

receiving an indication that the allocation unit is to change from being unmapped to being mapped based on the allocation unit being added to the logical address space of the host system, and wherein the data is received to be written to the allocation unit in view of the allocation unit being added to the logical address space.

13. A system comprising:

a memory component; and a processing device, operatively coupled with the memory component, to:

receive an indication that an allocation unit of a memory sub-system has become unmapped;

in response to receiving the indication that the allocation unit of the memory sub-system has become unmapped, programming the allocation unit with a data pattern based on a direction of voltage change of a threshold voltage distribution of the allocation unit;

receive data to be written to the unmapped allocation unit; and perform a write operation to program the received data at the unmapped allocation unit by using a read voltage that is based on the data pattern.

14. The system of claim 13, wherein to perform the write operation, the processing device is further to:

perform a pre-read operation of the unmapped allocation unit by applying the read voltage to the unmapped allocation unit to retrieve a stored value;

compare the stored value with a value of the received data; and determine whether to write the value of the received data at the allocation unit based on the comparison of the stored value with the value of the received data.

15. The system of claim 13, wherein the allocation unit comprises a plurality of memory cells, and wherein the programming of the allocation unit with the data pattern corresponds to programming the plurality of memory cells to be at a high voltage state, and wherein the read voltage is lower than a voltage level of the high voltage state.

16. The system of claim 13, wherein the allocation unit comprises a plurality of memory cells, and wherein the programming of the allocation unit with the data pattern corresponds to programming the plurality of memory cells to be at a low voltage state, and wherein the read voltage is higher than a voltage level of the low voltage state.

17. The system of claim 13, wherein the allocation unit is unmapped based on the allocation unit being removed from a logical address space of a host system.

18. The system of claim 17, wherein the processing device is further to:
 receive an indication that the allocation unit is to change from being unmapped to being mapped based on the allocation unit being added to the logical address space of the host system, and wherein the data is received to be written to the allocation unit in view of the allocation unit being added to the logical address space.

\* \* \* \* \*